United States Patent [19]
Ito

[11] Patent Number: 5,825,207
[45] Date of Patent: Oct. 20, 1998

[54] OUTPUT BUFFER CIRCUIT

[75] Inventor: Junji Ito, Oita, Japan

[73] Assignee: Kabushiki Kaisha Toshiba, Kawasaki, Japan

[21] Appl. No.: 684,588

[22] Filed: Jul. 19, 1996

[30] Foreign Application Priority Data

Jul. 21, 1995 [JP] Japan .................................... 7-185258

[51] Int. Cl.⁶ ............................................. H03K 19/0175
[52] U.S. Cl. ................................ 326/83; 326/82; 326/80; 327/108
[58] Field of Search .................... 326/83, 82, 62, 326/80, 85; 327/108

[56] References Cited

U.S. PATENT DOCUMENTS

| | | | |
|---|---|---|---|
| 4,123,671 | 10/1978 | Aihara et al. | 326/83 |
| 4,529,890 | 7/1985 | Kobayashi et al. | 327/108 |
| 4,952,818 | 8/1990 | Erdelyi et al. | 326/82 |
| 5,198,747 | 3/1993 | Haight | 327/108 |

*Primary Examiner*—Huan Hoang
*Attorney, Agent, or Firm*—Foley & Lardner

[57] ABSTRACT

An output buffer circuit includes first and second transistors of a first conductivity type, having first terminals connected in common and second terminals connected to first and second power supplies. The output buffer circuit also includes third and fourth transistors of a second conductivity type, having first terminals connected in common and second terminals connected to third and fourth power supplies. First and second resistors connected in series are connected between a common connecting point of the first and second transistors, and a common connecting point of the third and fourth transistors. A connecting neutral point serves as an output terminal. Damage resulting from excessive current or pass-through current when executing a switching process can thereby be prevented.

2 Claims, 4 Drawing Sheets

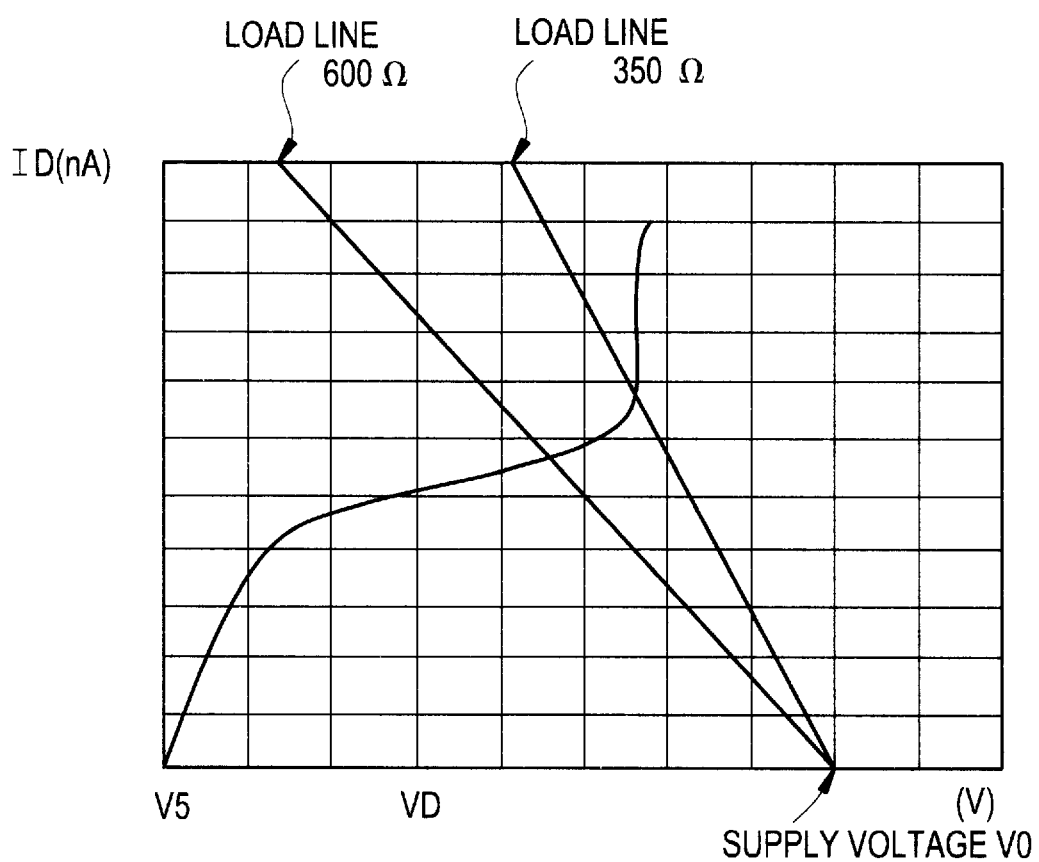

OUTPUT BUFFER CIRCUIT

The present invention relates to an output buffer circuit and, more particularly, to an output buffer circuit suitable as a common driver circuit of a liquid crystal display element (LCD).

An operation of the prior art LCD driver circuit will be explained with reference to FIGS. 1 through 3.

There are a variety of methods of driving the LCD. However, according to a typical static method, displaying is performed by applying pulse signals to a commonly-used electrode defined as a common electrode and to a segment electrode for every pixel.

The prior art LCD driver, particularly, the common driver circuit, has a configuration as shown in FIG. 1.

To start with, respective source electrodes of series-connected P-channel transistors 41, 42 connected to a drain electrode in common are connected respectively to power supply terminals V0, V1 for driving liquid crystal devices. Similarly, individual source electrodes of series-connected N-channel MOS transistors 43, 44 connected to a drain electrode in common are connected respectively to liquid crystal driving power supply terminals V4, V5. A resistor 45 is connected between a drain common connecting point of the P-channel MOS transistors 41, 43 and a drain common connecting point of the N-channel MOS transistors 43, 44. Furthermore, the common connecting point of the N-channel MOS transistors 43, 44 is connected to an output terminal 40 via a resistor 46.

Power supply voltages of these liquid crystal driving power supply terminals bear the following relationship:

V0>V1>V4>V5

Furthermore, frame signal FR are supplied to gates of the P- and N-channel MOS transistors 41, 43, while frame signals /FR (/denotes logically negative hereinafter) are supplied to gates of P- and N-channel MOS transistors 42, 44.

Next, the operation of the thus constructed driver circuit will be described.

FIGS. 2A–2F show drive waveforms of a driver LSI using the common driver illustrated in FIG. 1 and a segment driver (not shown) having a configuration similar thereto. It is herein assumed that there are provided n-pieces of common electrodes. FIG. 2A shows an output waveform of a common bias electrode COM1. FIG. 2B illustrates an output waveform of a common bias electrode COM2. FIG. 2C illustrates an output waveform of a common bias electrode COMn. FIG. 2D shows an output waveform of a segment bias electrode (which is hereinafter referred to as SEG). FIG. 2E shows an output waveform of a display segment. FIG. 2F shows a potential difference between turned-on pixels. Note that a in FIG. 2F represents a bias ratio (which is, however, a positive constant).

Herein, it is assumed that frame signal (hereinafter abbreviated to FR)=1, and a selection potential V0 and a non-selection potential V4 are supplied to scan electrodes (hereinafter termed COM). Further, when FR=0, a selection potential V5 and a non-selection potential V1 are supplied to COM.

On the other hand, when FR=0, a display potential V5 and a non-selection potential V3 are supplied to SEG. When FR=1, a display potential V0 and a non-selection potential V2 are supplied to SEG. With this above-mentioned arrangement, the turning on voltage and turning off voltage are applied to the liquid crystal, thus operating the display.

Moreover, the resistor 45 works to restrain a pass-through current instantaneously flowing when switching an output buffer. The resistor 46 works as an internal protective resistor when an excessive surge enters from the output terminal side.

Herein, the operation of this circuit will be explained with reference to FIG. 2.

There are five paths of (1) V0–V1, (2) V0–V4, (3) V1–V4, (4) V1–V5, and (5) V4–V5 as current paths in the output waveform of the common operation. In (1) V0–V1 and (5) V4–V5 among the five paths given above, a potential difference is as small as several volts. With respect to the remaining three paths indicated by the arrows (2), (3) and (4) in FIG. 1, several tens of volts are applied, and hence there arises a problem in which the pass-through current also increase a when effecting a switching process.

Next, an explanation will be given with reference to FIG. 3. FIG. 3 is a graphic chart showing a statistic characteristic of the N-channel MOS transistor having a high anti-pressure structure, wherein the X-axis indicates a voltage, and Y-axis indicates a drain current ID.

Shown at the same time in FIG. 3 is the drain current ID when the voltage changes with a load resistance serving as a parameter in combination with a static characteristic curve of the transistor. With respect to the voltages higher than points at which these rectilinear lines intersect the characteristic curve, as shown in FIG. 3, when a gate bias and a source/drain voltage VDS increase in the N-channel MOS transistor, a break-down correspondingly occurs when exceeding a certain value, with the result that an excessive current IDS flows. Then, this might lead to the a problem that a source-to-source or drain-to-drain aluminum wire to be current path is to be blown due to excessive current.

In connection with the above-described problems, the voltage is divided by inserting the resistor 45 therebetween, thus preventing destruction of the aluminum wire. Normally, this resistance value is determined as follows.

A synthetic resistance (output resistance: Ron) from each power supply to the output terminal is set on the order of 400 ohms, and therefore the resistance value of the resistor 45 is obtained by subtracting resistance values of the resistor 46 and an ON-resistance of the transistor from the above synthetic resistance.

In the circuit illustrated in FIG. 1, however, if the resistance value of the resistor 45 is large, it is impossible to provide sufficient power supply levels of, resulting in difficulty in driving the liquid crystal drive. This therefore brings about a problem in which display quality declines.

As described above, according to the prior art, when restraining excessive current, the output of each power supply becomes deficient, resulting in the problem that the aluminum conductor is blown. The resistance value can not also be increased, and pass-through current in the buffer portion can not be restrained.

SUMMARY OF THE INVENTION

Accordingly, it is a primary object of the present invention to provide a semiconductor integrated circuit capable of restraining both a pass-through current and an excessive current and of preventing the occurrence of aluminum fusion.

According to one aspect of the invention, in a semiconductor integrated circuit of the present invention, respective sources of P-channel MOS transistors 11, 12 connected in series are connected to power supply terminals V1, V0, respectively. Similarly, respective sources of N-channel MOS transistors 13, 14 connected in series are connected to power supply terminals V4, V5, individually. Further, a drain connected in common to the P-channel MOS transistors 11, 12 is connected to one terminal of a resistor 15. A drain connected in common to the N-channel MOS transistors 13, 14 is connected to one terminal of a resistor 16. Then, individual other terminals of the resistors 15, 16 are connected in common to an output terminal 10.

BRIEF DESCRIPTION OF THE DRAWINGS

Other objects and advantages of the present invention will become apparent during the following discussion in conjunction with the accompanying drawings, in which:

FIG. 3 is a graph showing a static characteristic of an N-channel MOS transistor having a high anti-pressure structure that is illustrated in FIG. 1.

DESCRIPTION OF THE PREFERRED EMBODIMENT

An embodiment of the present invention will hereinafter be described with reference to the drawings.

Figure 4:
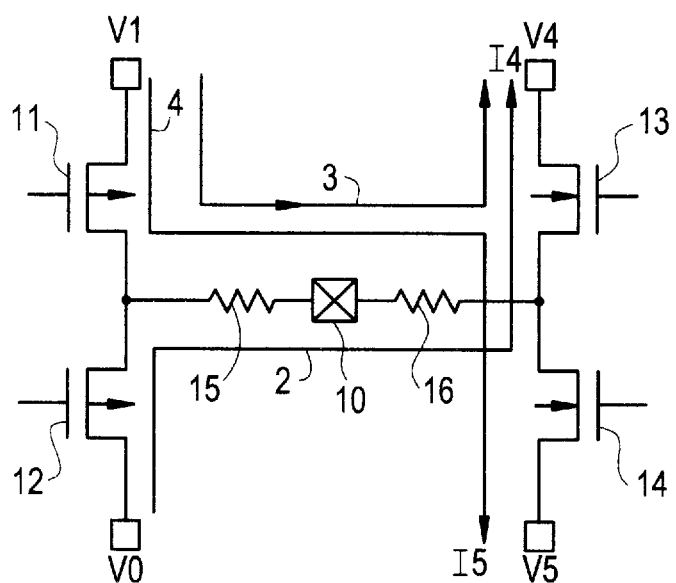
FIG. 4 is a circuit diagram illustrating a configuration of a liquid crystal driver circuit in accordance with one embodiment of the present invention.

FIG. 4 is a circuit diagram showing a configuration of one embodiment of a liquid crystal driver circuit according to the present invention.

In this circuit, respective source electrodes of series-connected P-channel MOS transistors 11, 12 connected in common to a drain electrode are connected to liquid crystal driving power supply terminals V1, V0, respectively. Similarly, source electrodes of series-connected N-channel MOS transistors 13, 14 connected in common to a drain electrode are connected to liquid crystal driving power supply terminals V4, V5, individually. Two resistors 15 and 16 are connected in series between a drain common connecting point of the P-channel MOS transistors 11, 12 and a drain common connecting point of the N-channel MOS transistors 13, 14. A connecting neutral point thereof serves as a terminal 10.

Next, the operation of this embodiment will be explained. There can be considered five paths of (1) V0–V1, (2) V0–V4, (3) V1–V4, (4) V1–V5, and (5) V4–V5 as current paths in an output waveform of a common operation as in the case of the prior art. Three paths hitherto exhibiting larger pass-through currents are indicated by arrows (2)–(4) in FIG. 4.

As compared with the configuration of the prior art, according to the present invention, a resistor 15 is inserted between the output terminal 10 and the common drain side between the P-channel MOS transistors 11, 12. A resistor 16 is inserted between the output terminal 10 and the common drain side between the N-channel MOS transistors 13, 14. These resistors 15, 16 work to restrain the pass-through current.

Herein, a difference in circuitry between the prior art and the present invention will be explained with reference to FIGS. 1, 3 and 4 by exemplifying a resistance value and ON-resistance of a buffer circuit.

Figure 1:
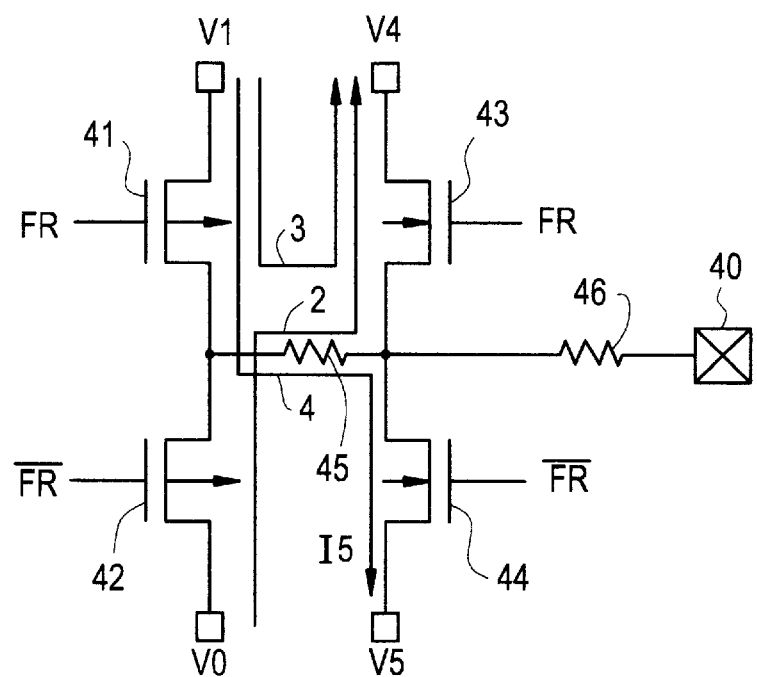
FIG. 1 is a circuit diagram illustrating a configuration of an output circuit according to the prior art.
Figure 2A:
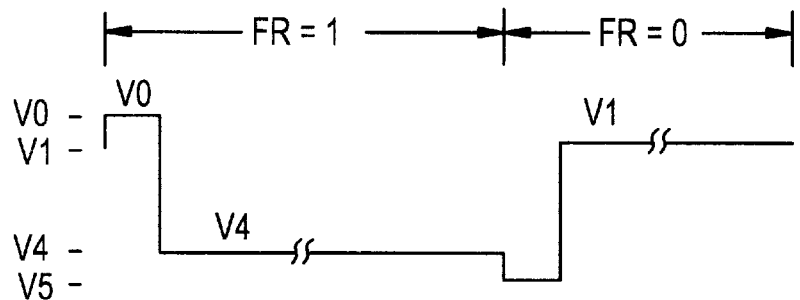
FIGS. 2A–2F are waveform diagrams each showing an operation waveform of a driver LSI including the output circuit shown in FIG. 1.
Figure 2B:
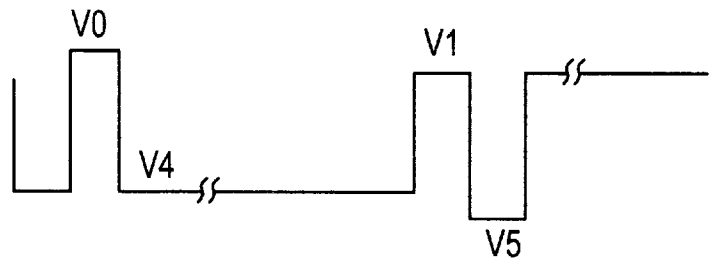
Figure 2C:
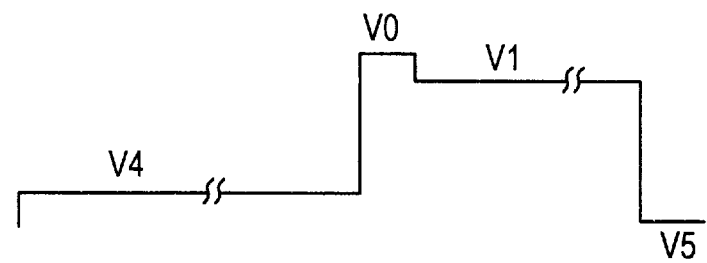
Figure 2D:
Figure 2E:
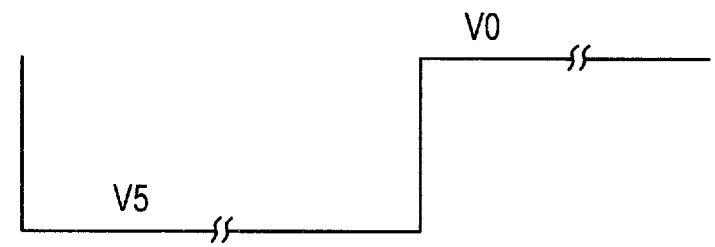
Figure 2F:
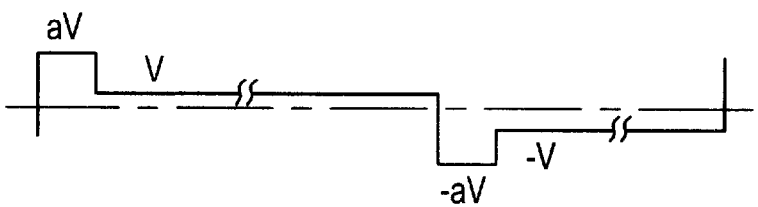

For example, in a current path 2 individually shown in FIG. 1, ON-resistances of the P- and N-channel MOS transistors 42, 43 are set to 200 ohms, a value of the resistor 46 is set to 50 ohms, and an output resistance Ron between the power supply terminal V0 and the output terminal 40 is set to 400 ohms. In this case, the resistor 45 comes to a value of 150 ohms.

Herein, FIG. 3 is a graph in which load rectilinear lines are plotted with respect to a static characteristic of the N-channel MOS transistor having a high anti-pressure structure. As shown in FIG. 3, a 350-ohm (ON-resistance 200 ohms plus 150 ohms of the resistor 45) load line showing a load applied on the N-channel MOS transistor 43 in FIG. 1, intersects a VG curve in a breakage area (corresponding to a portion where the curve in FIG. 3 sharply rises), wherein breakage tends to occur.

According to the present invention, however, as shown in FIG. 4, the resistors 15, 16 are inserted in the current path 2. If ON-resistances of the P- and N-channel MOS transistors 12, 13 are set to 200 ohms in the same way as the above-mentioned, a resistance value of 200 ohms can be added to resistance values of the respective resistors 15, 16. Hence, the pass-through current can be remarkably restrained in comparison with the structure of the prior art.

Therefore, resistance values larger than in the prior art can also be similarly added to paths 3, 4 other than the above-described current path where the pass-through current has hitherto been large, whereby the pass-through current can be reduced At this time, as illustrated in FIG. 3, a load line showing a load applied on the N-channel MOS transistor 13 is set as a 600-ohm (200 ohms of the resistor 15 plus 200 ohms of the resistors 16 plus ON-resistance 200 ohms of the P-channel MOS transistor 12) load line, wherein no breakage happens.

Further, the resistors 15, 16 also function as internal protective resistors as with the resistor 46 in the prior art.

As discussed above, according to the construction of the present invention, the resistances larger than in the prior art can be inserted in the pass-through current path without increasing the output resistance, and hence the pass-through current can be restrained without causing any aluminum fusion. Furthermore, excessive current can be restrained with the output resistance equal to or under the conventional output resistance without increasing a circuit area and causing any decline of display quality as compared with the construction of the prior art.

According to the present invention, the resistances larger than in the prior art can be inserted in the pass-through current path without increasing the output resistance, and it is therefore possible to restrain the pass-through current without causing any blow out of aluminum conductors.

It is apparent that, in this invention, a wide range of different working modes can be formed based on the invention without deviating from the spirit and scope of the invention. This invention is not restricted by its specific working modes except being limited by the appended claims.

What is claimed is:

1. An output buffer circuit comprising:
    a first transistor of a first conductivity type, having a first channel terminal connected to a first power supply terminal;
    a second transistor of the first conductivity type, having a second channel terminal connected to a second channel terminal of said first transistor and a first channel terminal connected to a second power supply terminal;
    a first resistor having a first terminal connected to a common connecting point of said second channel terminal of said first transistor and said second channel terminal of said second transistors, and a second terminal connected to an output terminal of the output buffer circuit;

a third transistor of a second conductivity type, having a first channel terminal connected to a third power supply terminal;

a fourth transistor of the second conductivity type, having a second channel terminal connected to a second channel terminal of said third transistor and a first channel terminal connected to a fourth power supply terminal; and a second resistor having a first terminal connected to a connecting point of said second channel terminal of said third transistor and said second channel terminal of said fourth transistors, and a second terminal connected to the output terminal of the output buffer circuit.

2. The output buffer circuit as claimed in claim 1, wherein each of a resistance of said first resistor and a resistance of said second resistor is approximately equal to an ON state resistance of said first to fourth transistors.

* * * * *